United States Patent
Kudyshev et al.

(10) Patent No.: US 12,372,882 B2
(45) Date of Patent: Jul. 29, 2025

(54) METROLOGY IN THE PRESENCE OF CMOS UNDER ARRAY (CUA) STRUCTURES UTILIZING AN EFFECTIVE MEDIUM MODEL WITH CLASSIFICATION OF CUA STRUCTURES

(71) Applicant: KLA Corporation, Milpitas, CA (US)

(72) Inventors: Zhaxylyk Kudyshev, Milpitas, CA (US); Chao Chang, Milpitas, CA (US); Derrick A. Shaughnessy, San Jose, CA (US); Houssam Chouaib, San Jose, CA (US)

(73) Assignee: KLA Corporation, Milpitas, CA (US)

( * ) Notice: Subject to any disclaimer, the term of this patent is extended or adjusted under 35 U.S.C. 154(b) by 217 days.

(21) Appl. No.: 18/217,199

(22) Filed: Jun. 30, 2023

(65) Prior Publication Data
US 2025/0004384 A1 Jan. 2, 2025

(51) Int. Cl.
*G03F 7/00* (2006.01)
*G06F 30/27* (2020.01)
*G06F 30/30* (2020.01)

(52) U.S. Cl.
CPC ........ *G03F 7/706841* (2023.05); *G06F 30/27* (2020.01); *G06F 30/30* (2020.01)

(58) Field of Classification Search
None
See application file for complete search history.

(56) References Cited

U.S. PATENT DOCUMENTS

| | | | |
|---|---|---|---|
| 5,608,526 | A | 3/1997 | Piwonka-Corle et al. |
| 5,859,424 | A | 1/1999 | Norton et al. |
| 6,429,943 | B1 | 8/2002 | Opsal et al. |
| 7,478,019 | B2 | 1/2009 | Zangooie et al. |

(Continued)

OTHER PUBLICATIONS

Korean Intellectual Property Office, International Search Report and Written Opinion received in International Application No. PCT/US2024/033692, Sep. 24, 2024, 8 pages.

(Continued)

*Primary Examiner* — Leigh M Garbowski
(74) *Attorney, Agent, or Firm* — Suiter Swantz IP

(57) ABSTRACT

A system, may include a controller configured to cause the processors to implement a measurement recipe by: receiving optical measurement data for training samples after a first process step for fabricating complementary metal-oxide-semiconductor (CMOS) under array (CuA) devices, wherein the CuA devices include first structures with a non-uniform spatial distribution; classifying the first structures into spatially-continuous regions based on unsupervised clustering; receiving optical measurement data for the training samples after a second process step, wherein the CuA devices after the second process step include periodic second structures above the first structures; developing effective medium models for the first structures; developing measurement models for determining measurements of the CuA devices; receiving optical measurement data for test samples after the second process step; and generating values of the metrology measurements of the second structures based on the optical measurement data for the test samples and the measurement models.

36 Claims, 6 Drawing Sheets

(56) References Cited

U.S. PATENT DOCUMENTS

| | | | |
|---|---|---|---|
| 7,831,528 B2 * | 11/2010 | Doddi | G06N 20/00 |
| | | | 706/22 |
| 7,929,667 B1 | 4/2011 | Zhuang et al. | |
| 7,933,026 B2 | 4/2011 | Opsal et al. | |
| 9,291,554 B2 | 3/2016 | Kuznetsov et al. | |
| 9,885,962 B2 | 2/2018 | Veldman et al. | |
| 9,915,522 B1 | 3/2018 | Jiang et al. | |
| 10,013,518 B2 | 7/2018 | Bakeman et al. | |
| 10,101,670 B2 | 10/2018 | Pandev et al. | |
| 10,133,192 B2 | 11/2018 | Tinnemans et al. | |
| 10,324,050 B2 | 6/2019 | Hench et al. | |
| 10,352,695 B2 | 7/2019 | Dziura et al. | |
| 10,458,912 B2 | 10/2019 | Chouaib et al. | |
| 10,502,694 B2 | 12/2019 | Dziura et al. | |
| 10,769,320 B2 | 9/2020 | Kuznetsov et al. | |
| 10,775,323 B2 | 9/2020 | Gellineau et al. | |
| 10,794,839 B2 | 10/2020 | Rosenberg et al. | |
| 10,935,893 B2 * | 3/2021 | Pandev | G03F 7/70641 |
| 11,036,898 B2 | 6/2021 | Chouaib et al. | |
| 11,156,548 B2 | 10/2021 | Nguyen et al. | |
| 11,313,809 B1 | 4/2022 | Pandev et al. | |
| 11,333,621 B2 | 5/2022 | Wack et al. | |
| 11,415,898 B2 * | 8/2022 | Pandev | H01L 21/67253 |
| 11,555,689 B2 | 1/2023 | Chouaib et al. | |
| 11,573,077 B2 | 2/2023 | Chouaib et al. | |
| 2009/0198635 A1 | 8/2009 | Doddi et al. | |
| 2014/0172394 A1 | 6/2014 | Kuznetsov et al. | |
| 2015/0046118 A1 | 2/2015 | Pandev et al. | |
| 2015/0046121 A1 | 2/2015 | Dziura et al. | |
| 2018/0106735 A1 | 4/2018 | Gellineau et al. | |
| 2019/0017946 A1 | 1/2019 | Wack et al. | |
| 2021/0109453 A1 | 4/2021 | Pandev | |
| 2021/0207956 A1 | 7/2021 | Shchegrov et al. | |
| 2023/0402328 A1 * | 12/2023 | Miller | G01N 21/45 |
| 2024/0011921 A1 * | 1/2024 | Zuvela | G01N 21/9501 |

OTHER PUBLICATIONS

Kline et al., "X-ray scattering critical dimensional metrology using a compact x-ray source for next generation semiconductor devices," Journal of Micro/Nanolithography, MEMS and MOEMS, Jan.-Mar. 2017, 11 pages.

Lemaillet et al., "Intercomparison between optical and x-ray scatterometry measurements of FinFET structures," Proceedings of SPIE—The International Society for Optical Engineering, Apr. 2013, 8 pages.

\* cited by examiner

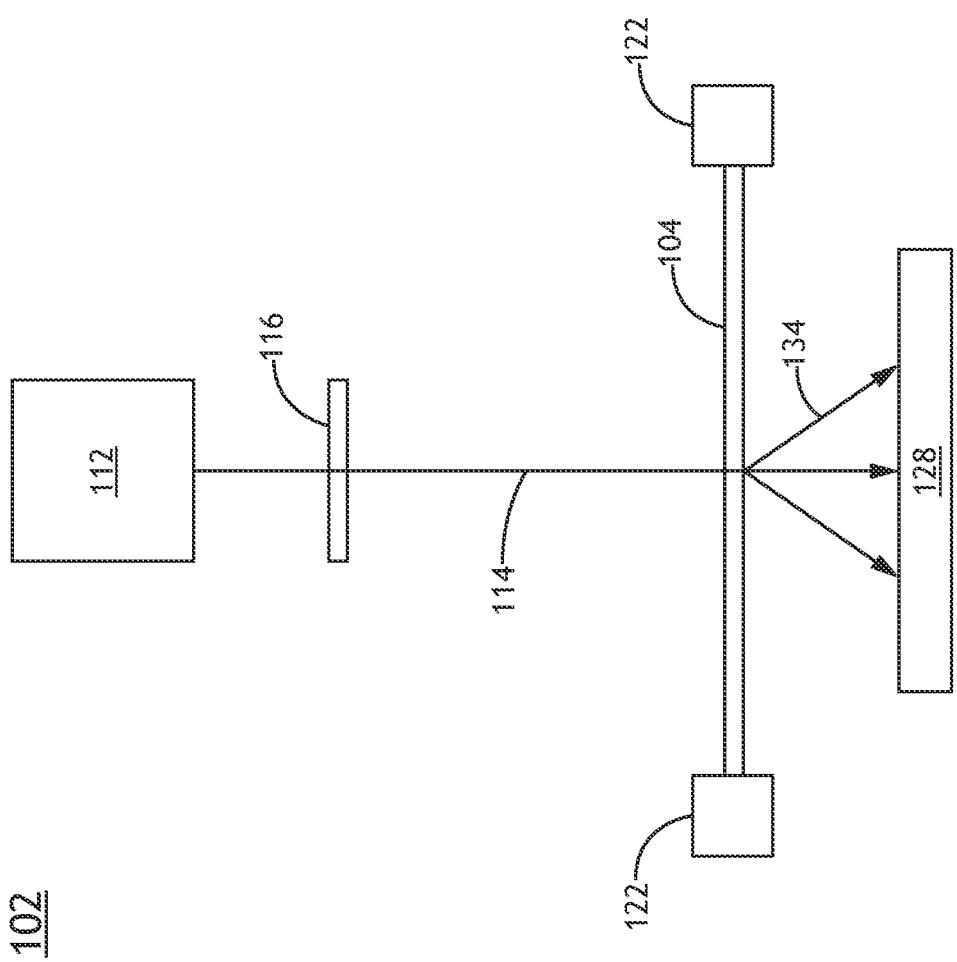

METROLOGY IN THE PRESENCE OF CMOS UNDER ARRAY (CUA) STRUCTURES UTILIZING AN EFFECTIVE MEDIUM MODEL WITH CLASSIFICATION OF CUA STRUCTURES

TECHNICAL FIELD

The present disclosure relates generally to optical metrology and, more particularly, to optical metrology of memory structures including buried CMOS structures.

BACKGROUND

One approach to meeting demands for increased performance of memory devices (e.g., 3D memory devices) while maintaining or reducing physical size is to fabricate CMOS circuitry (e.g., logic circuitry) beneath memory array structures. This approach is commonly referred to as a complementary metal-oxide-semiconductor (CMOS) under array (CuA) technique. However, CuA techniques present unique challenges for metrology systems used for process control since the underlying CMOS circuitry may influence measurements of the memory array structures. There is therefore a need to develop systems and methods to address the above challenges.

SUMMARY

A system is disclosed in accordance with one or more illustrative embodiments of the present disclosure. In embodiments, the system includes a controller including one or more processors configured to execute program instructions causing the one or more processors to implement a measurement recipe by: receiving optical measurement data for one or more training samples after a first process step for fabricating complementary metal-oxide-semiconductor (CMOS) under array (CuA) devices, wherein the CuA devices include first structures with a non-uniform spatial distribution after the first process step; classifying the first structures into spatially-continuous regions based on unsupervised clustering of the optical measurement data for the one or more training samples after the first process step; receiving optical measurement data for the one or more training samples after a second process step for fabricating the CuA devices, wherein the CuA devices after the second process step include periodic second structures above the first structures; developing effective medium models for the spatially-continuous regions of the first structures; developing measurement models for determining one or more measurements of the CuA devices based on the effective medium models for the spatially-continuous regions of the first structures and the optical measurement data for the one or more training samples after the second process step; receiving optical measurement data for one or more test samples after the second process step for fabricating the CuA devices; and generating values of the one or more metrology measurements of the second structures on the one or more test samples based on the optical measurement data for the one or more test samples and the measurement models.

A system is disclosed in accordance with one or more illustrative embodiments of the present disclosure. In embodiments, the system includes an optical characterization system. In embodiments, the system includes a controller communicatively coupled with the optical characterization system, the controller including one or more processors configured to execute program instructions causing the one or more processors to implement a measurement recipe by: receiving optical measurement data for one or more training samples after a first process step for fabricating complementary metal-oxide-semiconductor (CMOS) under array (CuA) devices from the optical characterization system, wherein the CuA devices include first structures with a non-uniform spatial distribution after the first process step; classifying the first structures into spatially-continuous regions based on unsupervised clustering of the optical measurement data for the one or more training samples after the first process step; receiving optical measurement data for the one or more training samples after a second process step for fabricating the CuA devices from the optical characterization system, wherein the CuA devices after the second process step include periodic second structures above the first structures; developing effective medium models for the spatially-continuous regions of the first structures; developing measurement models for determining one or more measurements of the CuA devices based on the effective medium models for the spatially-continuous regions of the first structures and the optical measurement data for the one or more training samples after the second process step; receiving optical measurement data for one or more test samples after the second process step for fabricating the CuA devices from the optical characterization system; and generating values of the one or more metrology measurements of the second structures on the one or more test samples based on the optical measurement data for the one or more test samples and the measurement models.

A method is disclosed, in accordance with one or more illustrative embodiments of the present disclosure. In embodiments, the method includes generating optical measurement data for one or more training samples after a first process step for fabricating complementary metal-oxide-semiconductor (CMOS) under array (CuA) devices, wherein the CuA devices include first structures with a non-uniform spatial distribution after the first process step. In embodiments, the method includes classifying the first structures into spatially-continuous regions based on unsupervised clustering of the optical measurement data for the one or more training samples after the first process step. In embodiments, the method includes generating optical measurement data for the one or more training samples after a second process step for fabricating the CuA devices, wherein the CuA devices after the second process step include periodic second structures above the first structures. In embodiments, the method includes developing effective medium models for the spatially-continuous regions of the first structures. In embodiments, the method includes developing measurement models for determining one or more measurements of the CuA devices based on the effective medium models for the spatially-continuous regions of the first structures and the optical measurement data for the one or more training samples after the second process step. In embodiments, the method includes generating optical measurement data for one or more test samples after the second process step for fabricating the CuA devices. In embodiments, the method includes generating values of the one or more metrology measurements of the second structures on the one or more test samples based on the optical measurement data for the one or more test samples and the measurement models.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures.

FIG. 1C is a simplified schematic of the characterization sub-system configured as an x-ray characterization sub-system, in accordance with one or more embodiments of the present disclosure.

DETAILED DESCRIPTION

Figure 1A:
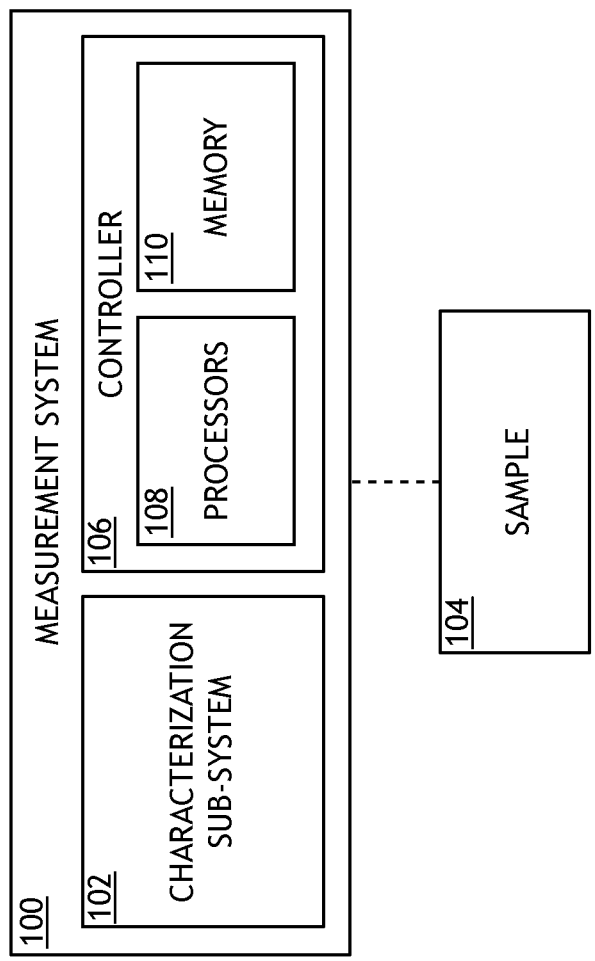
FIG. 1A is a block diagram of a measurement system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for optical metrology of complementary metal-oxide-semiconductor (CMOS) under array (CuA) devices based on identification of spatial variations of CMOS structures (e.g., logic structures), effective medium modeling of different spatial regions of the CMOS structures, and modeling of the impact of different CMOS structures on optical measurement data. The systems and methods disclosed herein may provide highly accurate measurements of memory array structures that account for the presence of the underlying spatially-varying CMOS structures.

A CuA structure (e.g., a CuA memory structure) may generally include logic circuitry (e.g., CMOS logic circuitry, or the like) physically located beneath memory array structures (e.g., 3-dimensional (3D) memory stacks, 3D NAND structures, or the like). As used herein, the term CuA structure may cover a wide variety of designs of the logic and memory array structures. In this way, the present disclosure is not limited to any particular CuA architecture.

Optical metrology is commonly used for semiconductor process control since it may provide relatively high measurement throughput and is typically non-destructive. In optical metrology, a sample is illuminated with light and a measurement is generated based on corresponding light emanating from the sample. Optical metrology of sub-surface features typically requires that light propagate through at least upper portions of the sample to reach the sub-surface features of interest. As a result, optical metrology systems typically utilize wavelengths of light selected to propagate through the structures of interest with relatively low absorption.

However, in the case of CuA structures, incident light may interact with both memory array structures and buried CMOS structures in a way that may impair the ability to generate isolated measurements for the memory array structures. It is contemplated herein that existing optical metrology techniques may be inadequate to accurately characterize CuA structures, particularly as the dimensions shrink and device complexity increases. For example, some techniques may rely on wavelengths of light that are in a transparency window for the memory array structures of interest, but may be at least partially absorbed by the underlying logic circuitry. As an illustration, some logic circuitry may utilize poly-silicon layers that absorb light with wavelengths greater than around 450 nanometers (nm). In this case, optical metrology with wavelengths lower than about 450 nm may generate isolated measurements of memory array structures. However, such a technique may be limited to select CuA designs that incorporate such absorbing materials, may provide limited sensitivity for deep structures, and may further provide limited value for broadband optical measurement methods that benefit from multi-wavelength data. As another example, some techniques rely on supervised training of artificial neural networks using optical measurement data with labels generated through additional measurement methods. However, these techniques may have various limitations such as, but not limited to, a requirement of high sampling of ground truth reference data, substantial time required to generate sufficient labels for training, limited performance for deeply buried structures, insensitivity to process changes, and general inapplicability for CuA structures outside the training dataset.

In some embodiments of the present disclosure, optical metrology of CuA structures is performed using physics-based models such as, but not limited to, rigorous coupled-wave analysis (RCWA), which may require periodic features on a sample being characterized. In the case of CuA structures, the memory array structures are typically periodic and thus suitable for such physics-based models, but the underlying CMOS structures may not be. In some embodiments, a workaround to this limitation is to further model the CMOS structures as a periodic film stack providing an effective medium with properties that correspond to those of the CMOS structures.

However, it is contemplated herein that the CMOS structures may be spatially-varying (e.g., may vary across the sample) such that it may not be sufficient to model the CMOS structures as a uniform 1D effective medium.

In some embodiments, unsupervised classification is used to identify spatially-varying regions of the CMOS structures such that different effective medium models may be developed for the different regions of the CMOS structures. For example, an unsupervised clustering technique (e.g., a k-nearest neighbor technique, a support vector machine (SVM) technique, a neural network technique, or the like) may be applied to optical measurement data from training samples including CMOS structures prior to the fabrication of the memory array structures. Such training samples may include the CMOS structures alone or samples including the CMOS structures plus mold structures (e.g., a series of unpatterned films that serve as precursors to fully-fabricated memory array structures). The unsupervised clustering technique may thus identify different spatial regions (e.g., clusters) of the CMOS structures that differently impact the optical measurement data. Different effective medium models may then be developed for the different regions.

Subsequently, full physics-based models may be developed for the various regions. In some embodiments, additional optical measurement data from the training samples generated after fabrication of the memory array structures (e.g., after fabrication of full CuA structures) may be used to develop the full physics-based models for the various regions. Once the physics-based models are developed, they may be used for optical metrology of newly-fabricated CuA structures (e.g., test CuA structures) in a production line.

It is further contemplated herein that the systems and methods disclosed herein may be suitable for a wide range of CuA designs. In cases where the test CuA structures share the same design of the underlying CMOS structures as the test CuA structures, the layout of spatially-varying regions of CMOS structures (e.g., clusters) is unchanging and the application of the proper physics-based models for the various regions may be readily applied. However, the test CuA structures may not necessarily have the same design of the underlying CMOS structures in all applications. In this case, it may be necessary to determine which physics-based model should be used for optical metrology of each location on a test sample. In some embodiments, a supervised machine learning algorithm is trained with the optical measurement data of full CuA structures and labels generated from the unsupervised clustering step. Such a supervised machine learning algorithm may then determine the appropriate measurement model to use for each region on a test CuA structure.

Referring now to FIGS. 1A-3, systems and methods for characterizing CuA structures are described in greater detail, in accordance with one or more embodiments of the present disclosure.

FIG. 1A is a block diagram of a measurement system 100, in accordance with one or more embodiments of the present disclosure. In some embodiments, the measurement system 100 includes a characterization sub-system 102 to generate measurement data of a sample 104 using optical techniques and a controller 106 to generate one or more measurements based on the measurement data.

The characterization sub-system 102 may include any components or combination of components suitable for generating measurement data on a sample 104.

In some embodiments, the characterization sub-system 102 includes an optical characterization sub-system 102 to generate measurement data based on interaction of the sample 104 with light. For example, the characterization sub-system 102 may include, but is not limited to, a spectroscopic ellipsometer (SE), an SE with multiple angles of illumination, an SE measuring Mueller matrix elements (e.g. using rotating compensator(s)), a single-wavelength ellipsometer, a beam profile ellipsometer (angle-resolved ellipsometer), a beam profile reflectometer (angle-resolved reflectometer), a broadband reflective spectrometer (spectroscopic reflectometer), a single-wavelength reflectometer, an angle-resolved reflectometer, an imaging system, a scatterometer (e.g., speckle analyzer), or any combination thereof.

In some embodiments, the characterization sub-system 102 includes an x-ray characterization sub-system 102 to generate measurement data based on interaction of the sample 104 with x-rays. For example, the characterization sub-system 102 may include, but is not limited to, a small-angle x-ray scattering (SAXS) system or an x-ray reflection scatterometry (SXR) system.

In some embodiments, the characterization sub-system 102 includes a particle-beam characterization sub-system 102 to generate measurement data based on interaction of the sample 104 with a particle beam such as, but not limited to, an electron beam (e-beam), an ion beam, or a neutral particle beam.

In some embodiments, a characterization sub-system 102 provides multiple types of measurements. In some embodiments, a measurement system 100 includes multiple measurement sub-systems 102, each providing a different combination of one or more measurements. Further, the measurement system 100 may be provided as a single tool or multiple tools. A single tool providing multiple measurement configurations is generally described in U.S. Pat. No. 7,933,026 issued on Apr. 26, 2011, which is incorporated herein by reference in its entirety. Multiple tool and structure analysis is generally described in U.S. Pat. No. 7,478,019 issued on Jan. 13, 2009, which is incorporated herein by reference in its entirety.

Further, U.S. Pat. No. 10,458,912, titled "Model based optical measurements of semiconductor structures with anisotropic dielectric permittivity," issued on Oct. 29, 2019; U.S. Pat. No. 11,573,077, titled "Scatterometry based methods and systems for measurement of strain in semiconductor structures," issued on Feb. 7, 2023; U.S. Pat. No. 11,036,898, titled "Measurement models of nanowire semiconductor structures based on re-useable sub-structures," issued on Jun. 15, 2021; U.S. Pat. No. 11,555,689, titled "Measuring thin films on grating and bandgap on grating," issued on Jan. 17, 2023; U.S. Pat. No. 11,156,548, titled "Measurement methodology of advanced nanostructures," issued on Oct. 26, 2021; and U.S. Pat. No. 10,794,839, titled "Visualization of three-dimensional semiconductor structures," issued on Oct. 6, 2020, which are all incorporated herein by reference in their entirety.

In some embodiments, the controller 106 includes one or more processors 108 configured to execute a set of program instructions maintained in a memory 110, or memory device, where the program instructions may cause the processors 108 to implement various actions.

The one or more processors 108 of a controller 106 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors 108 may include any device configured to execute algorithms and/or instructions (e.g., program instructions stored in memory). In some embodiments, the one or more processors 108 may be embodied as a desktop computer, mainframe computer system, workstation, image computer, parallel processor, networked computer, or any other computer system configured to execute a program configured to operate or operate in conjunction with the characterization sub-system 102, as described throughout the present disclosure. Moreover, different subsystems of the measurement system 100 may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller or, alternatively, multiple controllers. Additionally, the controller 106 may include one or more controllers housed in a common housing or within multiple housings. In this way, any controller or combination of controllers may be separately packaged as a module suitable for integration into measurement system 100.

The memory 110 may include any storage medium known in the art suitable for storing program instructions executable by the associated one or more processors 108. For example, the memory 110 may include a non-transitory memory medium. By way of another example, the memory 110 may include, but is not limited to, a read-only memory (ROM), a random-access memory (RAM), a magnetic or optical memory device (e.g., disk), a magnetic tape, a solid-state drive and the like. It is further noted that the memory 110 may be housed in a common controller housing with the one or more processors 108. In some embodiments, the memory 110 may be located remotely with respect to the physical location of the one or more processors 108 and the controller 106. For instance, the one or more processors 108 of the controller 106 may access a remote memory (e.g., server), accessible through a network (e.g., internet, intranet and the like).

The controller 106 may be communicatively coupled with any component or combination of components of the measurement system 100. In some embodiments, the controller 106 may receive data (e.g., measurement data, or the like) from one or more components of the measurement system 100. In some embodiments, the controller 106 controls one or more components of the measurement system 100 via drive signals. More generally, the controller 106 may implement any steps described in the present disclosure.

In some embodiments, the controller 106 generates one or more measurements of the sample 104 based at least in part on measurement data generated by the characterization sub-system 102. Measurements of parameters of interest may include a number of algorithms, which may be executed by the controller 106. For example, optical interaction of the incident beam with the sample 104 may be modeled using an EM (electro-magnetic) solver and may utilize algorithms as, but not limited to, rigorous coupled-wave analysis (RCWA), finite element method (FEM), method of moments, surface integral method, volume integral method, or finite-difference time-domain (FDTD) method. The sample 104 may be modeled (e.g., parametrized) using a geometric engine, a process modeling engine, or a combination of both. The use of process modeling is generally described in U.S. Pat. No. 10,769,320 issued on Sep. 8, 2020, which is incorporated herein by reference in its entirety. A geometric engine is implemented, for example, in AcuShape software by KLA Corporation.

The controller 106 may analyze collected measurement data using any suitable combination of data fitting and/or optimization techniques such as, but not limited to, libraries, fast-reduced-order models, regression, statistical methods, see e.g., "Statistical model-based metrology," by S. Pandev et al, U.S. Pat. No. 10,101,670; machine-learning algorithms (e.g., neural networks, support-vector machines (SVM), principal component analysis (PCA), independent component analysis (ICA), local-linear embedding (LLE), dimensionality reduction techniques more generally), sparse representation techniques, Fourier transform techniques, wavelet transform techniques, or Kalman filtering. Statistical model-based metrology is generally described in U.S. Pat. No. 10,101,670 issued on Oct. 16, 2018, which is incorporated herein by reference in its entirety. The controller 106 may analyze collected measurement data using algorithms that do not include modeling, optimization, and/or fitting. Patterned wafer characterization is generally described in U.S. Pat. No. 10,502,694 issued on Dec. 10, 2019, which is incorporated herein by reference in its entirety. In some embodiments, the controller 106 utilizes one or more algorithms to promote matching from the same or different tool types (e.g., different instances or configurations of a characterization sub-system 102).

The controller 106 may be designed to provide efficient performance through any suitable techniques such as, but not limited to, parallelization, distribution of computation, load balancing, multi-service support, dynamic load optimization, or the like. Further, the controller 106 may implement any steps using any type or combination of configurations such as, but not limited to, dedicated hardware (e.g., FPGAs, or the like), software, or firmware.

The controller 106 may further generate any type of measurement of the sample 104 (or a portion thereof) based at least in part on measurement data from the characterization sub-system 102. In some embodiments, the controller 106 generates a metrology measurement such as, but not limited to, an overlay measurement, a critical dimension (CD) measurement, a shape measurement (e.g., a height measurement, a tilt measurement, a sidewall angle measurement, or the like), a stress measurement, a composition measurement, a bandgap measurement, a measurement of electrical properties, or a measurement of process conditions (e.g., focus and/or dose conditions, a resist state, a partial pressure, a temperature, a focusing model, or the like). In some embodiments, the controller 106 generates an inspection measurement in which one or more defects on the sample 104 are at least one of identified or classified.

The measurement system 100 and any of its components (e.g., the characterization sub-system 102, the controller 106, or the like) may be configured to implement a recipe (e.g., a measurement recipe), which may define various configuration parameters and/or steps to be performed in a measurement or a series of measurements.

For example, a recipe may include various aspects of a design of a sample 104 (e.g., a design of CuA devices 202 on a sample 104) including, but not limited to, a layout of features on one or more sample layers, feature sizes, or feature pitches. As another example, a recipe may include illumination parameters such as, but not limited to, an illumination wavelength, an illumination pupil distribution (e.g., a distribution of illumination angles and associated intensities of illumination at those angles), a polarization of incident illumination, a spatial distribution of illumination, or a sample height. By way of another example, a recipe may include collection parameters such as, but not limited to, a collection pupil distribution (e.g., a desired distribution of angular light from the sample to be used for a measurement and associated filtered intensities at those angles), collection field stop settings to select portions of the sample of interest, polarization of collected light, or wavelength filters. By way of another example, a recipe may include various processing steps (e.g., that may be implemented by the controller 106 to generate measurements based on measurement data generated according to the recipe.

Figure 2:
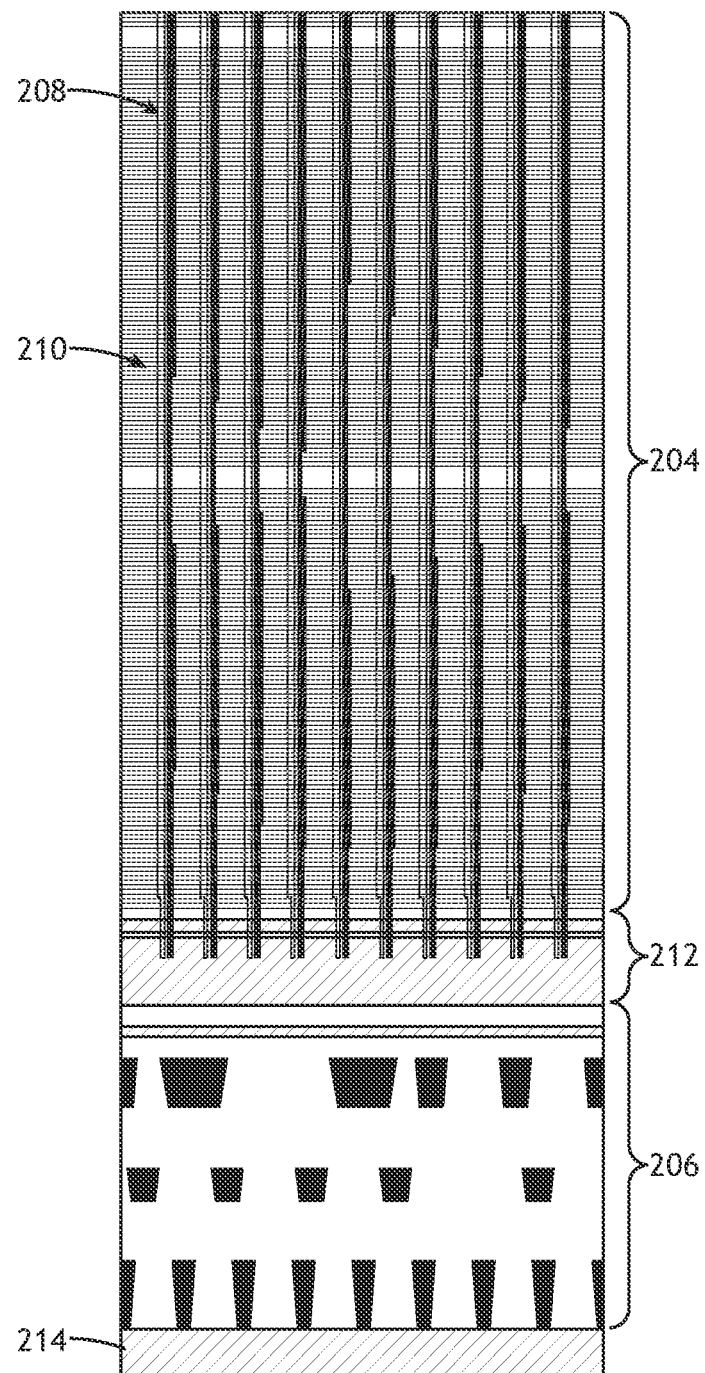
FIG. 2 is a simplified schematic of a CuA device, in accordance with one or more embodiments of the present disclosure.

Referring now to FIG. 2, FIG. 2 is a simplified schematic of a CuA device 202, in accordance with one or more embodiments of the present disclosure. A CuA device 202 may include memory array structures 204 and various CMOS structures 206 (e.g., logic structures, or the like) located beneath the memory array structures 204.

The memory array structures 204 may include any number or type of structures suitable for forming a memory array. For example, the memory array structures 204 may include, but are not limited to, 3D NAND structures formed from patterned features 208 within a multi-layer stack 210. Further, such memory array structures 204 are typically periodic structures with periodicity along one or more dimensions.

The CMOS structures 206 may include any number or type of structures fabricated beneath the memory array structures 204. For example, the CMOS structures 206 may be, but are not required to be, suitable for controlling and/or powering the memory array structures 204. In this way, the combination of the CMOS structures 206 and the memory array structures 204 may form a memory device (e.g., a 3D memory device). Further, the CMOS structures 206 may typically have a spatially-varying distribution such that the number and/or design of the constituent features may not be periodic across the CuA device 202. In this way, the CMOS structures 206 may generally be described as non-periodic. However, it is noted that CMOS structures 206 may exhibit local periodicity in some regions.

Further, the memory array structures 204 and/or the CMOS structures 206 may generally have any design such that the term CuA device 202 as used herein is not limited to any particular design. For example, a CuA device 202 may include intervening layers between the memory array structures 204 and the CMOS structures 206 such as, but not limited to a source layer 212 (e.g., a poly-silicon source layer, or the like). As another example, though not shown, a CuA device 202 may include intervening layers between the CMOS structures 206 and a substrate 214.

Figure 3:
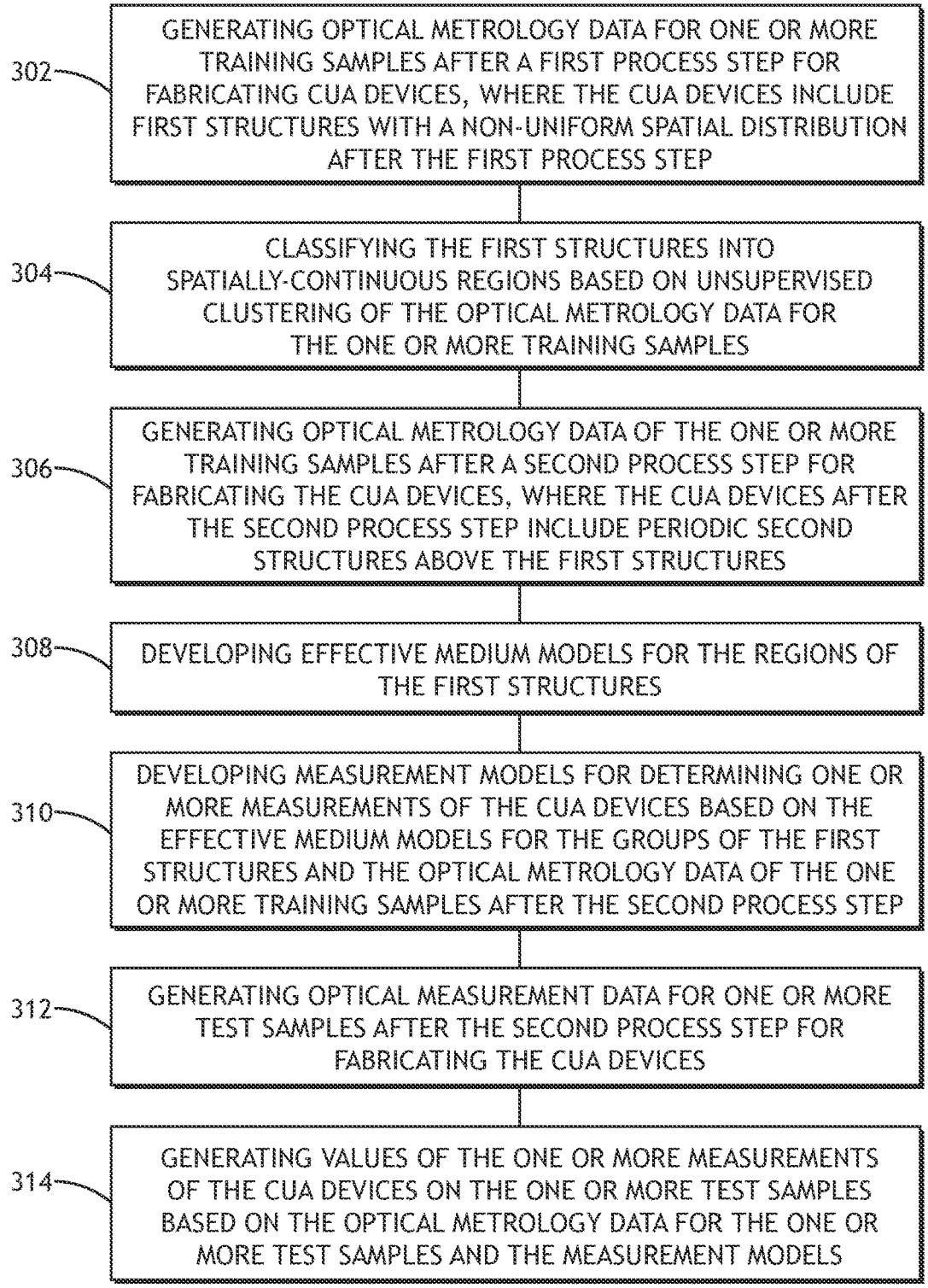
FIG. 3 is a flow diagram illustrating steps performed in a method for characterizing CuA devices, in accordance with one or more embodiments of the present disclosure.

Referring now to FIG. 3, techniques for characterizing CuA devices 202 or portions thereof are described in greater detail, in accordance with one or more embodiments of the present disclosure.

It may be desirable to generate measurements of the constituent structures of a CuA device 202 (e.g., the CMOS structures 206 and/or the memory array structures 204) at various stages of a fabrication process. Such measurements may include, but are not limited to, metrology measurements or defect measurements (e.g., inspection measurements). Metrology measurements may include, but are not limited to, an overlay measurement, a critical dimension (CD) measurement, a shape measurement (e.g., a height measurement, a tilt measurement, a sidewall angle measurement, or the like), a stress measurement, a composition measurement, a bandgap measurement, a measurement of electrical properties, or a measurement of process conditions (e.g., focus and/or dose conditions, a resist state, a partial pressure, a temperature, a focusing model, or the like). Inspection measurements may include, but are not limited to, identification and/or characterization of defects of a fabrication process (e.g., unwanted features, missing features, improperly shaped or positioned features, or the like). Further, such measurements may be used for a wide variety of purposes including, but not limited to, process control, disposition, or for estimating performance of fabricated CuA devices 202.

Measurements may be generated after any process step for the fabrication of a CuA device 202. For example, measurements may be generated after the fabrication of CMOS structures 206 and/or after the fabrication of memory array structures 204 to form a full CuA device 202. For the purposes of illustration, measurements of a full CuA device 202 including both memory array structures 204 and underlying CMOS structures 206 are referred to herein as "full loop" measurements.

It is contemplated herein that measurements at one process step may generally provide information about any features fabricated on the sample 104 depending on the interaction of an illumination beam 114 with the sample 104. In this way, it may be challenging to perform isolated measurements of newly fabricated features. For example, full loop measurements may generally provide information for or be impacted by both the memory array structures 204 and underlying CMOS structures 206, which may limit or impair the ability to generate isolated measurements of the memory array structures 204.

In some embodiments, measurements of various test structures may be generated to assist in generating isolated measurements of certain features. For example, measurements of a test structure including memory array structures 204 without corresponding buried CMOS structures 206 are referred to herein as "short loop" measurements.

Further, measurements at any process step may generally be generated using any suitable technique including, but not limited to, optical techniques, x-ray techniques, particle-based techniques, or the like. However, different measurement techniques may provide different tradeoffs. For example, optical measurement techniques may generally provide non-destructive measurements with a high measurement throughput but may have limited resolution or may be limited to certain types of structures (e.g., periodic structures) based on the corresponding analysis or modeling steps. Optical measurements are thus commonly utilized during run-time when throughput is particularly important. As another example, x-ray and/or particle-based techniques may provide higher resolution than some optical techniques but may suffer from relatively low throughput and/or may be destructive measurements. As a result, such techniques are commonly used for reference measurements.

However, it is contemplated herein that it may not be feasible or desirable in all applications to generate all possible types of measurements at all measurement steps. In such cases, different techniques may be utilized to generate measurements of specific structures (e.g., isolated measurements of memory array structures 204) depending on available data.

FIG. 3 is a flow diagram illustrating steps performed in a method 300 for characterizing CuA devices 202, in accordance with one or more embodiments of the present disclosure. Applicant notes that the embodiments and enabling technologies described previously herein in the context of the measurement system 100 should be interpreted to extend to the method 300. For example, any of the steps associated with the method 300 may be implemented by the controller 106 and/or a characterization sub-system 102 of the measurement system 100. It is further noted, however, that the method 300 is not limited to the architecture of the measurement system 100.

It is contemplated herein that the method 300 may be suitable for, but not limited to, applications in which it is desirable to generate isolated measurements of memory array structures 204 without the use of short loop measurements. One goal of this approach is to develop effective representations of CMOS structures 206 that may be used in physics-based models that generally rely on the presence of periodic structures such as, but not limited to, RCWA techniques. One obstacle associated with this approach is that the CMOS structures 206 are generally not periodic and thus not directly compatible with such physics-based models requiring periodic structures. In some embodiments, an effective medium modeling technique is used to model the CMOS structures 206 as an effective medium, where properties of the effective medium vary spatially to capture spatial variations of the CMOS structures 206.

In some embodiments, the method 300 includes a step 302 of generating optical measurement data for one or more training samples after a first process step for fabricating CuA devices, where the CuA devices include first structures with a non-uniform spatial distribution after the first process step. For example, the first structures may include CMOS structures 206. As another example, the first structures may include CMOS structures 206 plus mold structures, which may include multiple deposited material layers to be patterned into the memory array structures 204. In this way, the mold structures may correspond to precursors of the memory array structures 204.

Figure 1B:
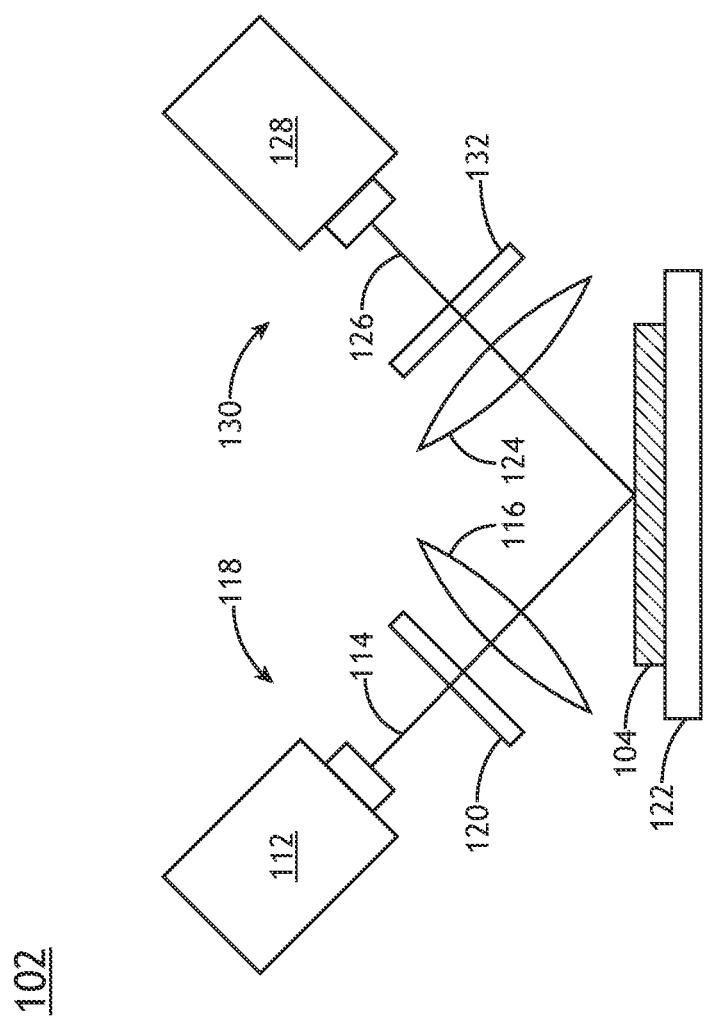
FIG. 1B is a simplified schematic of the characterization sub-system configured as an optical characterization sub-system, in accordance with one or more embodiments of the present disclosure.

The optical measurement data may include any type of data generated by any type of optical system such as, but not limited to, the optical characterization sub-system 102 depicted in FIG. 1B. For example, the optical measurement data may include, but is not limited to, spectral data from an ellipsometer, a reflectometer, or a scatterometer (e.g., ellipsometry data, reflectometry data, or scatterometry data, respectively).

Further, in some embodiments, the one or more training samples include known variations of the first structures (e.g., associated with expected process deviations). In this way, the impact of such variations may be identified and incorporated into the models of the method 300 described below. Such a procedure may be referred to as a design of experiments (DOE) and may improve the robustness of the method 300.

In some embodiments, the method 300 includes a step 304 of classifying the first structures into spatially-continuous regions based on unsupervised clustering of the optical measurement data for the one or more training samples. It is contemplated herein that structural variations of the number and/or design of the first structures may differently impact the optical measurement data of the first structures (e.g., as generated in step 302). Accordingly, an unsupervised clustering technique may divide the sample into different spatially-continuous regions with similar optical measurement data such that the different regions may be separately modeled. It is noted that classifying the first structures into regions based on the optical measurement data rather than the design of the first structures may beneficially generate groupings based on the actual impact on the optical measurement data of interest.

The step 304 may utilize any unsupervised clustering technique known in the art such as, but not limited to, a k-nearest neighbor technique, a SVM technique, or a neural network adapted for unsupervised clustering.

In some embodiments, the method 300 includes a step 306 of generating optical measurement data of the one or more training samples after a second process step for fabricating the CuA devices 202, wherein the CuA devices 202 after the second process step include periodic second structures above the first structures. For example, the second structures may include periodic memory array structures 204. The optical measurement data generated in step 306 may thus correspond to full-loop data.

In some embodiments, the method 300 includes a step 308 of developing effective medium models for the regions of the first structures. In some embodiments, the method 300 includes a step 310 of developing measurement models for determining one or more measurements of the CuA devices 202 based on the effective medium models for the groups of the first structures and the optical measurement data of the one or more training samples after the second process step.

The measurements may characterize any portion of a CuA device 202 such as, but not limited to, memory array structures 204 or CMOS structures 206.

As an illustration, various properties of the CuA device 202 (or a specific portion thereof) may be provided as floating parameters in the model with values that may be obtained by fitting optical data to the measurement model. One or more measurements of the CuA device 202 or any constituent features thereof (e.g., the memory array structures 204 and/or the CMOS structures 206) may be generated based on these the values of the floating parameters determined by the fit, either directly or in combination. Non-limiting examples of such measurements include, but are not limited to, overlay, CD, height, tilt, defect identification, or defect classification.

In some embodiments, the measurement model requires various assumptions or constraints on the associated features on the sample such as, but not limited to, periodicity of the features. In these cases, the first structures (e.g., the CMOS structures 206 alone and/or with mold structures) which may generally be non-periodic (but may have some local periodicity) as an effective material having effective properties that provide optical measurement data that matches the measured optical measurement data from step 302. This process may be repeated in step 308 for each of the regions identified by unsupervised clustering in step 304.

For example, an effective medium model may treat the first structures as an effective medium formed either as a single material or a stack of different materials and provide an expression for an effective dispersion of this effective medium. In this way, various parameters associated with the effective medium such as, but not limited to, the thickness or dispersion of any of the layers may be provided as floating parameters that may be determined by fitting against the optical measurement data provided in step 302 either directly or against values derived from this data. The effective medium models may utilize any techniques and/or dispersion models such as, but not limited to, a harmonic oscillator model, a Tauc-Lorentz model, a Cauchy model, a Bruggeman effective medium approximation (BEMA) model, or an nk-offset model.

Further, the effective medium models for each region may be used to generate measurement models for each of these regions in step 310. As a result, any number of measurements of the memory array structures 204 and/or the CMOS structures 206 may be generated based on fitting optical measurement data to the measurement models of step 310 in a manner that accounts for spatial variations of the CMOS structures 206 that impact the optical measurement data.

The measurement models developed in step 310 may include any type of model or combination of models that incorporate the different effective medium models for the regions of the first structures.

In some embodiments, the measurement models developed in step 310 may include a physics-based model in which properties of the CuA device 202 are related to metrology measurements of interest through a model of interactions between one or more illumination beams 114 and properties of the constituent features. Any suitable physics-based measurement model may be used such as, but not limited to, an RCWA model, a FEM model, a method of moments model, a surface integral model, a volume integral model, or a FDTD model.

In some embodiments, the measurement models developed in step 310 include machine learning models trained at least in part with data generated from a physics-based model as described above. For example, the method 300 may include a step of generating synthetic measurement data using the physics-based measurement models with a range of parameters describing synthetic CuA devices 202. The method 300 may then include a step of training a machine learning model to generate the one or more measurements based on training data, wherein the training data includes at least one of the optical measurement data for the one or more training samples or the synthetic data describing the synthetic CuA devices 202. In this way, the physics-based models may be used to provide supplemental training data beyond the experimental data associated with the training and/or test samples described above (e.g., optical measurement data and/or reference data).

For example, the synthetic measurement data may include synthesized equivalents of optical measurement data (e.g., that may be generated by an optical characterization sub-system 102) based on various combinations of geometric and dispersion parameters of CuA devices 202. As an illustration, different combinations of the geometric and dispersion parameters of the memory array structures 204 and the effective medium model of the CMOS structures 206 may be provided to the physics-based measurement model as inputs to generate synthetic measurement data as outputs. This synthetic measurement data may thus be characterized as a synthesized DOE suitable for providing training data for the machine learning model.

The measurement models developed in step 310 may then be used during a fabrication process to generate measurements of additional samples with unknown properties (e.g., test samples).

In some embodiments, the method 300 includes a step 312 of generating optical measurement data for one or more test samples after the second process step for fabricating the CuA devices 202. In this way, the step 312 may include generating full-loop data for CuA devices 202 on test samples.

In some embodiments, the method 300 includes a step 314 of generating values of the one or more measurements of the CuA devices 202 on the one or more test samples based on the optical measurement data for the one or more test samples and the measurement models. For example, the optical measurement data from step 312 may be fit to the measurement models of step 310 to determine values of various parameters of the CuA devices 202. The measurements may characterize any aspects of the CuA devices 202 on the test samples such as, but not limited to, the memory array structures 204 or the CMOS structures 206. In particular, it is noted that the step 314 may provide accurate measurements of the memory array structures 204 in the presence of the spatially non-uniform CMOS structures 206 based on the associated modeling of the different regions as described above.

It is further contemplated herein that the step 314 may be used to generate measurements of a wide range of CuA devices 202 on the test samples. In a general sense, it may be necessary to determine which measurement model from step 314 (e.g., associated with a particular region identified in step 304) to utilize for a particular arbitrary location on a test sample.

In some embodiments, the CuA devices 202 on the training and test samples have substantially the same design. In these cases, the location of each region within a CuA device 202 may be known and fixed such that corresponding measurement models for each region may be applied when generating measurements for the CuA devices 202 on the test samples.

In some embodiments, the CuA devices 202 on the training and test samples differ either by design or as a result of process variations. In these cases, it may be necessary to select the appropriate measurement model to use for each location on a test sample. In some embodiments, the method 300 further includes a step of training a supervised machine learning model based on the measured optical measurement data from step 306 (e.g., full-loop data from the CuA devices 202 on the training samples) with labels associated with the associated regions identified in step 304. In this way, the trained supervised machine learning model may classify each location on a test sample as being similar to one of the regions identified in step 304 such that the appropriate effective medium model (e.g., from step 308) and measurement models (e.g., from step 310) may be applied. For example, the step 314 may include selecting, for each location on the one or more test samples, one of the measurement models using the machine learning model with the associated optical measurement data from the locations on the one or more test samples and may further include generating, for each location on the one or more test samples, values of the one or more metrology measurements based on the optical measurement data for the one or more test samples and the selected one of the measurement model.

The measurements of the CuA devices 202 on the test samples may then be utilized for a variety of purposes. In some embodiments, the measurements are used for process control, disposition, and/or estimating performance of the CuA devices 202 on the test samples. For example, the measurements may be used to generate correctables for one or more process tools (e.g., scanners, steppers, or the like) in a feedback and/or feedforward process.

Figure 1D:
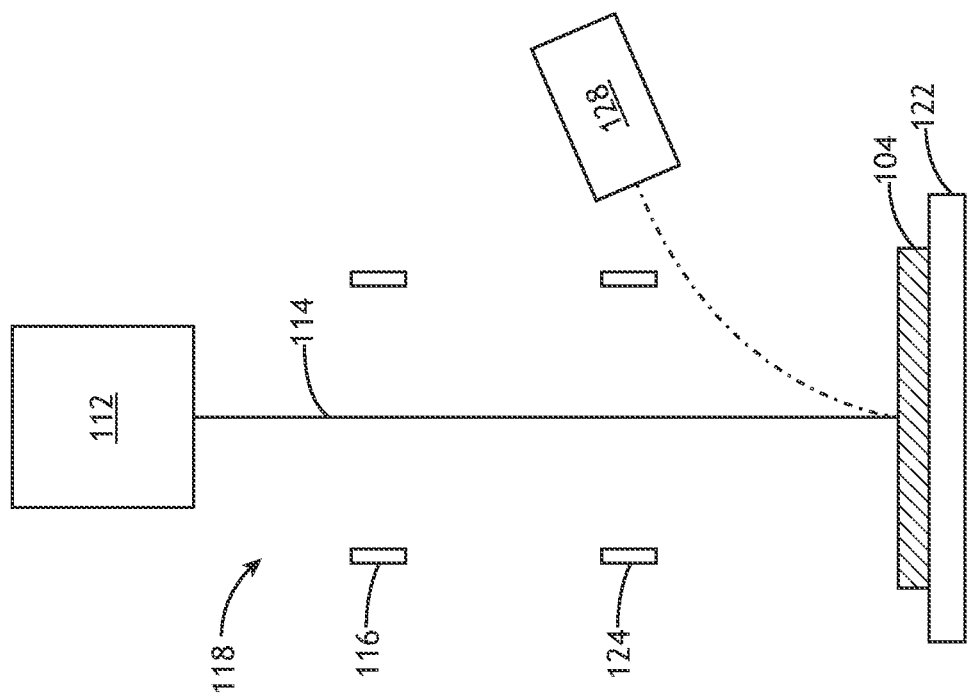
FIG. 1D is a simplified schematic of the characterization sub-system configured as a particle beam characterization sub-system, in accordance with one or more embodiments of the present disclosure.

Referring now to FIGS. 1B-1D, various non-limiting configurations of the characterization sub-system 102 are described in greater detail, in accordance with one or more embodiments of the present disclosure.

In some embodiments, the characterization sub-system 102 is an optical measurement sub-system that generates measurement data based on interaction of the sample 104 with light. FIG. 1B is a simplified schematic of the characterization sub-system 102 configured as an optical characterization sub-system 102, in accordance with one or more embodiments of the present disclosure. For example, the characterization sub-system 102 may include, but is not limited to, a spectroscopic ellipsometer (SE), an SE with multiple angles of illumination, an SE measuring Mueller matrix elements (e.g., using rotating compensator(s)), a single-wavelength ellipsometer, a beam profile ellipsometer (e.g., angle-resolved ellipsometer), a beam profile reflectometer (e.g., angle-resolved reflectometer), a broadband reflective spectrometer (e.g., spectroscopic reflectometer), a single-wavelength reflectometer, an angle-resolved reflectometer, an imaging system, a scatterometer (e.g., speckle analyzer), or any combination thereof.

In some embodiments, the characterization sub-system 102 includes an illumination source 112 configured to generate at least one illumination beam 114. The illumination from the illumination source 112 may include one or more selected wavelengths of light including, but not limited to, ultraviolet (UV) radiation, visible radiation, or infrared (IR) radiation. For example, the characterization sub-system 102 may include one or more apertures at an illumination pupil plane to divide illumination from the illumination source 112 into one or more illumination beams 114 or illumination lobes. In this regard, the characterization sub-system 102 may provide dipole illumination, quadrature illumination, or the like. Further, the spatial profile of the one or more illumination beams 114 on the sample 104 may be controlled by a field-plane stop to have any selected spatial profile.

The illumination source 112 may include any type of illumination source suitable for providing at least one illumination beam 114. In some embodiments, the illumination source 112 is a laser source. For example, the illumination source 112 may include, but is not limited to, one or more narrowband laser sources, a broadband laser source, a supercontinuum laser source, a white light laser source, or the like. In some embodiments, the illumination source 112 includes a laser-sustained plasma (LSP) source. For example, the illumination source 112 may include, but is not limited to, a LSP lamp, a LSP bulb, or a LSP chamber suitable for containing one or more elements that, when excited by a laser source into a plasma state, may emit broadband illumination. In some embodiments, the illumination source 112 includes a lamp source. In some embodiments, the illumination source 112 may include, but is not limited to, an arc lamp, a discharge lamp, an electrode-less lamp, or the like.

The illumination source 112 may provide the one or more illumination beams 114 using free-space techniques and/or optical fibers.

In some embodiments, the characterization sub-system 102 directs the illumination beam 114 to the sample 104 through at least one illumination lens 116 (e.g., an objective lens) via an illumination pathway 118. The illumination pathway 118 may include one or more optical components suitable for modifying and/or conditioning the illumination beam 114 as well as directing the illumination beam 114 to the sample 104. In some embodiments, the illumination pathway 118 includes one or more illumination-pathway optics 120 to shape or otherwise control the illumination beam 114. For example, the illumination-pathway optics 120 may include, but are not limited to, one or more field stops, one or more pupil stops, one or more polarizers, one or more filters, one or more beam splitters, one or more diffusers, one or more homogenizers, one or more apodizers, one or more beam shapers, or one or more mirrors (e.g., static mirrors, translatable mirrors, scanning mirrors, or the like).

The characterization sub-system 102 may position the sample 104 for a measurement using any suitable technique. In some embodiments, as illustrated in FIG. 1B, the characterization sub-system 102 includes a sample stage 122 including one or more actuators (e.g., linear actuators, tip/tilt actuators, rotational actuators, or the like) to position the sample 104 with respect to the illumination beam 114. In some embodiments, though not explicitly shown, the characterization sub-system 102 includes beam-scanning optics (e.g., galvanometer mirrors, scanning prisms, or the like) to adjust a position and/or scan one or more illumination beams 114.

In some embodiments, the characterization sub-system 102 includes at least one collection lens 124 to capture light or other radiation emanating from the sample 104, which is referred to herein as collected light 126, and direct this collected light 126 to one or more detectors 128 through a collection pathway 130. The collection pathway 130 may include one or more optical elements suitable for modifying and/or conditioning the collected light 126 from the sample 104. In some embodiments, the collection pathway 130 includes one or more collection-pathway optics 132 to shape or otherwise control the collected light 126. For example, the collection-pathway optics 132 may include, but are not limited to, one or more field stops, one or more pupil stops, one or more polarizers, one or more filters, one or more beam splitters, one or more diffusers, one or more homogenizers, one or more apodizers, one or more beam shapers, or one or more mirrors (e.g., static mirrors, translatable mirrors, scanning mirrors, or the like).

The characterization sub-system 102 may generally include any number or type of detectors 128. For example, the characterization sub-system 102 may include at least one single-pixel detector 128 such as, but not limited to, a photodiode, an avalanche photodiode, or a single-photon detector. As another example, the characterization sub-system 102 may include at least one multi-pixel detector 128 such as, but not limited to, a charge-coupled device (CCD) or a complementary metal-oxide semiconductor (CMOS) device, a line detector, or a time-delay integration (TDI) detector.

A detector 128 may be located at any selected location within the collection pathway 130. In some embodiments, the characterization sub-system 102 includes a detector 128 at a field plane (e.g., a plane conjugate to the sample 104) to generate an image of the sample 104. In some embodiments, the characterization sub-system 102 includes a detector 128 at a pupil plane (e.g., a diffraction plane) to generate a pupil image. In this regard, the pupil image may correspond to an angular distribution of light from the sample 104 detector 128. For instance, diffraction orders associated with diffraction of the illumination beam 114 from the sample 104 may be imaged or otherwise observed in the pupil plane. In a general sense, a detector 128 may capture any combination of reflected (or transmitted), scattered, or diffracted light from the sample 104.

The illumination pathway 118 and the collection pathway 130 of the characterization sub-system 102 may be oriented in a wide range of configurations. For example, as illustrated in FIG. 1B, the illumination pathway 118 and the collection pathway 130 may contain non-overlapping optical paths. In some embodiments, though not explicitly shown, the characterization sub-system 102 may include a beamsplitter oriented such that a common objective lens may simultaneously direct the illumination beam 114 to the sample 104 and capture collected light 126.

FIG. 1C is a simplified schematic of the characterization sub-system 102 configured as an x-ray characterization sub-system 102, in accordance with one or more embodiments of the present disclosure. Such a characterization sub-system 102 may be configured as, but is not limited to, a small-angle x-ray scatterometer (SAXR) or a soft x-ray reflectometer (SXR). X-ray characterization systems and associated measurement techniques are generally described in U.S. Pat. No. 7,929,667 issued on Apr. 19, 2011; U.S. Pat. No. 9,885,962 issued on Feb. 6, 2018; U.S. Pat. No. 10,013,518 issued on Jul. 3, 2018; U.S. Pat. No. 10,324,050 issued on Jun. 18, 2019; U.S. Pat. No. 10,352,695 issued on Jul. 16, 2019; U.S. Pat. No. 10,775,323 issued on Sep. 15, 2020; Germer, et al., "Intercomparison between optical and x-ray scatterometry measurements of FinFET structures" Proc. SPIE, v. 8681, p. 86810Q (2013); Kline, et al. "X-ray scattering critical dimensional metrology using a compact x-ray source for next generation semiconductor devices." Journal of Micro/Nanolithography, MEMS, and MOEMS 16.1 (2017); U.S. Pat. No. 11,333,621 issued on May 17, 2022; and U.S. Patent Application No. 2021/0207956 published on Jul. 8, 2021; all of which are incorporated herein by reference in their entireties.

In some embodiments, the illumination source 112 is an x-ray source configured to generate an x-ray illumination beam 114 having any particle energies (e.g., soft x-rays, hard x-rays, or the like). The characterization sub-system 102 may then include any combination of components suitable for capturing an associated collection signal 134, which may include, but is not limited to, x-ray emissions, optical emissions, or particle emissions.

For example, the characterization sub-system 102 may include an x-ray illumination lens 116 suitable for collimating or focusing an x-ray illumination beam 114 and collection pathway lenses (not shown) suitable for collecting, collimating, and/or focusing the collection signal 134 from the sample 104. Further, the characterization sub-system 102 may include various illumination-pathway optics (not shown) and/or collection-pathway optics (not shown) such as, but not limited to, x-ray collimating mirrors, specular x-ray optics such as grazing incidence ellipsoidal mirrors, polycapillary optics such as hollow capillary x-ray waveguides, multilayer optics, or systems, or any combination thereof. In embodiments, the characterization sub-system 102 includes an x-ray detector 128 such as, but not limited to, an x-ray monochromator (e.g., a crystal monochromator such as a Loxley-Tanner-Bowen monochromator, or the like), x-ray apertures, x-ray beam stops, or diffractive optics (e.g., such as zone plates).

FIG. 1D is a simplified schematic of the characterization sub-system 102 configured as a particle beam characterization sub-system 102, in accordance with one or more embodiments of the present disclosure.

In one embodiment, the illumination source 112 includes a particle source (e.g., an electron beam source, an ion beam source, or the like) such that the illumination beam 114 includes a particle beam (e.g., an electron beam, a particle beam, or the like). The illumination source 112 may include any particle source known in the art suitable for generating a particle illumination beam 114. For example, the illumination source 112 may include, but is not limited to, an electron gun or an ion gun. In another embodiment, the illumination source 112 is configured to provide a particle beam with a tunable energy. For example, an illumination source 112 including an electron source may, but is not limited to, provide an accelerating voltage in the range of 0.1 kilovolt (kV) to 30 kV. As another example, an illumination source 112 including an ion source may, but is not required to, provide an ion beam with an energy in the range of 1 kilo-electron-volte (keV) to 50 keV.

In another embodiment, the illumination pathway 118 includes one or more particle focusing elements (e.g., an illumination lens 116, a collection lens 124, or the like). For example, the one or more particle focusing elements may include, but are not limited to, a single particle focusing element or one or more particle focusing elements forming a compound system. In another embodiment, the one or more particle focusing elements include an illumination lens 116 configured to direct the particle illumination beam 114 to the sample 104. Further, the one or more particle focusing elements may include any type of electron lenses known in the art including, but not limited to, electrostatic, magnetic, uni-potential, or double-potential lenses.

In another embodiment, the characterization sub-system 102 includes one or more particle detectors 128 to image or otherwise detect particles emanating from the sample 104. For example, the detector 128 may include an electron collector (e.g., a secondary electron collector, a backscattered electron detector, or the like). As another example, the detector 128 may include a photon detector (e.g., a photo-detector, an x-ray detector, a scintillating element coupled to photomultiplier tube (PMT) detector, or the like) for detecting electrons and/or photons from the sample surface.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A system, comprising:
   a controller including one or more processors configured to execute program instructions causing the one or more processors to implement a measurement recipe by:
      receiving optical measurement data for one or more training samples after a first process step for fabricating complementary metal-oxide-semiconductor (CMOS) under array (CuA) devices, wherein the CuA devices include first structures with a non-uniform spatial distribution after the first process step;
      classifying the first structures into spatially-continuous regions based on unsupervised clustering of the optical measurement data for the one or more training samples after the first process step;
      receiving optical measurement data for the one or more training samples after a second process step for fabricating the CuA devices, wherein the CuA devices after the second process step include periodic second structures above the first structures;
      developing effective medium models for the spatially-continuous regions of the first structures;
      developing measurement models for determining one or more measurements of the CuA devices based on the effective medium models for the spatially-continuous regions of the first structures and the optical measurement data for the one or more training samples after the second process step;
      receiving optical measurement data for one or more test samples after the second process step for fabricating the CuA devices; and generating values of the one or more metrology measurements of the second structures on the one or more test samples based on the optical measurement data for the one or more test samples and the measurement models.

2. The system of claim 1, wherein the first structures include CMOS structures.

3. The system of claim 1, wherein the first structures include CMOS structures and mold structures, wherein the mold structures include precursors to the second structures.

4. The system of claim 1, wherein the one or more measurements comprises:
an inspection measurement.

5. The system of claim 4, wherein the inspection measurement comprises:
at least one of an identification or a classification of a defect in the second structures.

6. The system of claim 1, wherein the first structures on the one or more test samples have a common spatial distribution as the first structures on the one or more training samples.

7. The system of claim 1, wherein the first structures on the one or more test samples have a different spatial distribution than the first structures on the one or more training samples.

8. The system of claim 1, wherein at least one of the effective dispersion models comprise:
at least one of a harmonic oscillator model, a Tauc-Lorentz model, a Cauchy model, a Bruggeman effective medium approximation (BEMA) model, or a nk-offset model.

9. The system of claim 1, wherein a particular one of the effective medium models describes a portion of the plurality of the first structures in a particular one of the spatially-continuous regions as one or more films.

10. The system of claim 9, wherein the one or more measurements comprises:
a metrology measurement.

11. The system of claim 10, wherein the metrology measurement comprises:
at least one of an overlay measurement, a critical dimension (CD) measurement, a shape measurement, a stress measurement, a composition measurement, a bandgap measurement, a measurement of electrical properties, or a measurement of process conditions.

12. The system of claim 9, wherein developing the effective medium model for at least one the spatially-continuous regions comprises:
determining at least one of dispersions or thicknesses of the one or more films through fitting to match the corresponding optical measurement data for the one or more training samples after the first process step.

13. The system of claim 1, wherein the measurement models are based on light-matter interactions with the CuA devices.

14. The system of claim 1, wherein the measurement models include machine learning models trained at least in part on synthesized data from models based on light-matter interactions with the CuA devices.

15. The system of claim 1, wherein performing the unsupervised clustering of the optical measurement data for the one or more training samples after the first process step to identify the spatially-continuous regions is implemented using at least one of a k-nearest neighbor algorithm, a support vector machine, or a neural network.

16. The system of claim 1, further comprising:
training a machine learning model based on the optical measurement data for the one or more training samples after the second process step and labels associated with the spatially-continuous regions based on unsupervised clustering of the optical measurement data for the one or more training samples after the first process step;
wherein generating the values of the one or more metrology measurements of the second structures on the one or more test samples based on the optical measurement data for the one or more test samples and the measurement models comprises:
selecting, for each location on the one or more test samples, one of the measurement models using the machine learning model with the associated optical measurement data from the locations on the one or more test samples; and
generating, for each location on the one or more test samples, values of the one or more metrology measurements based on the optical measurement data for the one or more test samples and the selected one of the measurement models.

17. The system of claim 1, wherein the optical measurement data for at least one of the training samples after the first process step or after the second process step and the one or more test samples comprises:
at least one of ellipsometry data, reflectometry data, or scatterometry data.

18. A system, comprising:
an optical characterization system; and
a controller communicatively coupled with the optical characterization system, the controller including one or more processors configured to execute program instructions causing the one or more processors to implement a measurement recipe by:
receiving optical measurement data for one or more training samples after a first process step for fabricating complementary metal-oxide-semiconductor (CMOS) under array (CuA) devices from the optical characterization system, wherein the CuA devices include first structures with a non-uniform spatial distribution after the first process step;
classifying the first structures into spatially-continuous regions based on unsupervised clustering of the optical measurement data for the one or more training samples after the first process step;
receiving optical measurement data for the one or more training samples after a second process step for fabricating the CuA devices from the optical characterization system, wherein the CuA devices after the second process step include periodic second structures above the first structures;
developing effective medium models for the spatially-continuous regions of the first structures;
developing measurement models for determining one or more measurements of the CuA devices based on the effective medium models for the spatially-continuous regions of the first structures and the optical measurement data for the one or more training samples after the second process step;
receiving optical measurement data for one or more test samples after the second process step for fabricating the CuA devices from the optical characterization system; and
generating values of the one or more metrology measurements of the second structures on the one or more test samples based on the optical measurement data for the one or more test samples and the measurement models.

19. The system of claim 18, wherein the optical characterization system comprises:
at least one of an ellipsometer, a reflectometer, or a scatterometer.

20. A method, comprising:
generating optical measurement data for one or more training samples after a first process step for fabricating complementary metal-oxide-semiconductor (CMOS) under array (CuA) devices, wherein the CuA devices include first structures with a non-uniform spatial distribution after the first process step;
classifying the first structures into spatially-continuous regions based on unsupervised clustering of the optical measurement data for the one or more training samples after the first process step;
generating optical measurement data for the one or more training samples after a second process step for fabricating the CuA devices, wherein the CuA devices after the second process step include periodic second structures above the first structures;
developing effective medium models for the spatially-continuous regions of the first structures;
developing measurement models for determining one or more measurements of the CuA devices based on the effective medium models for the spatially-continuous regions of the first structures and the optical measurement data for the one or more training samples after the second process step;
generating optical measurement data for one or more test samples after the second process step for fabricating the CuA devices; and
generating values of the one or more metrology measurements of the second structures on the one or more test samples based on the optical measurement data for the one or more test samples and the measurement models.

21. The method of claim 20, wherein the first structures include complementary metal-oxide-semiconductor (CMOS) structures.

22. The method of claim 20, wherein the first structures include CMOS structures and mold structures, wherein the mold structures include precursors to the periodic second structures.

23. The method of claim 20, wherein the one or more measurements comprises:
a metrology measurement.

24. The method of claim 23, wherein the metrology measurement comprises:
at least one of an overlay measurement, a critical dimension (CD) measurement, a shape measurement, a stress measurement, a composition measurement, a bandgap measurement, a measurement of electrical properties, or a measurement of process conditions.

25. The method of claim 20, wherein the one or more measurements comprises:
an inspection measurement.

26. The method of claim 25, wherein the inspection measurement comprises:
at least one of an identification or a classification of a defect in the second structures.

27. The method of claim 20, wherein the first structures on the one or more test samples have a common spatial distribution as the first structures on the one or more training samples.

28. The method of claim 20, wherein the first structures on the one or more test samples have a different spatial distribution than the first structures on the one or more training samples.

29. The method of claim 20, wherein at least one of the effective dispersion models comprises:
at least one of a harmonic oscillator model, a Tauc-Lorentz model, a Cauchy model, a Bruggeman effective medium approximation (BEMA) model, or a nk-offset model.

30. The method of claim 20, wherein a particular one of the effective medium models describes a portion of the plurality of the first structures in a particular one of the spatially-continuous regions as one or more films.

31. The method of claim 30, wherein developing the effective medium model for at least one of the spatially-continuous regions comprises:
determining at least one of dispersions or thicknesses of the one or more films through fitting to match the corresponding optical measurement data for the one or more training samples after the first process step.

32. The method of claim 20, wherein the measurement models are based on light-matter interactions with the CuA devices.

33. The method of claim 20, wherein the measurement models include machine learning models trained at least in part on synthesized data from models based on light-matter interactions with the CuA devices.

34. The method of claim 20, wherein performing the unsupervised clustering of the optical measurement data for the one or more training samples after the first process step to identify the spatially-continuous regions is implemented using at least one of a k-nearest neighbor algorithm, a support vector machine, or a neural network.

35. The method of claim 20, further comprising:
training a machine learning model based on the optical measurement data for the one or more training samples after the second process step and labels associated with the spatially-continuous regions based on the unsupervised clustering of the optical measurement data for the one or more training samples after the first process step;
wherein generating the values of the one or more metrology measurements of the second structures on the one or more test samples based on the optical measurement data for the one or more test samples and the measurement models comprises:
selecting, for each location on the one or more test samples, one of the measurement models using the machine learning model with the associated optical measurement data from the locations on the one or more test samples; and
generating, for each location on the one or more test samples, values of the one or more metrology measurements based on the optical measurement data for the one or more test samples and the selected one of the measurement models.

36. The method of claim 20, wherein the optical measurement data for at least one of the training samples after the first process step or after the second process step and the one or more test samples comprises:
at least one of ellipsometry data, reflectometry data, or scatterometry data.

* * * * *